(12) United States Patent
Jacobson et al.

(10) Patent No.: US 6,314,539 B1
(45) Date of Patent: Nov. 6, 2001

(54) BOUNDARY-SCAN REGISTER CELL WITH BYPASS CIRCUIT

(75) Inventors: Neil G. Jacobson, Mountain View; Derek R. Curd, Fremont, both of CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/176,659

(22) Filed: Oct. 21, 1998

(51) Int. Cl.[7] .................................................. G01R 31/28
(52) U.S. Cl. ............................................................ 714/727
(58) Field of Search .................................. 714/724–727; 716/17; 326/39; 324/158.1

(56) References Cited

U.S. PATENT DOCUMENTS

| | | | |
|---|---|---|---|
| 5,150,044 | * | 9/1992 | Hashizume et al. ............... 324/158.1 |
| 5,544,174 | * | 8/1996 | Abend .................................. 714/727 |
| 5,570,375 | * | 10/1996 | Tasi et al. ............................ 714/727 |
| 5,726,999 | * | 3/1998 | Bradford et al. .................... 714/727 |
| 5,809,036 | * | 9/1998 | Champlin ............................ 714/727 |
| 5,991,908 | * | 11/1999 | Baxter et al. ........................ 714/727 |
| 6,071,314 | * | 6/2000 | Baxter et al. .......................... 716/17 |

* cited by examiner

Primary Examiner—Phung M. Chung
Assistant Examiner—Shelly A Chase

(74) Attorney, Agent, or Firm—Bever Hoffman & Harms, LLP

(57) ABSTRACT

A Boundary-Scan register (BSR) cell including a bypass circuit for selectively routing data signals around the data shift register of the BSR cell so that the BSR cell can be effectively removed from a BSR chain during Boundary-Scan Test procedures involving IEEE Standard 1149.1 compliant integrated circuits. In one embodiment, the BSR cell includes a bypass MUX having a first input terminal connected to a test data input (TDI) terminal of the BSR cell, a second input terminal connected to an output terminal of the shift register, and an output terminal connected to the test data output (TDO) terminal. The BSR cell operates in a "normal" mode (i.e., included in the BSR chain) when the bypass MUX is controlled to pass data signals output from the shift register to the TDO terminal. In contrast, the BSR cell is selectively bypassed (i.e., removed from the BSR chain) when the bypass MUX is controlled to pass the TDI signal to the TDO terminal. The BSR cell also includes mode control MUX having a first input terminal connected to receive a MODE signal generated by a Boundary-Scan TAP controller, a second input terminal connected to an OFF (disable) signal source, and an output terminal connected to the output MUX of the BSR cell. When the BSR cell operates in the "normal", the mode control MUX is controlled to pass the MODE signal to the output MUX. In contrast, when the BSR cell is selectively bypassed, the OFF signal is passed to the output MUX.

15 Claims, 14 Drawing Sheets

BOUNDARY-SCAN REGISTER CELL WITH BYPASS CIRCUIT

FIELD OF THE INVENTION

The present invention relates to IEEE Standard 1149.1 compliant ICs, and more particularly to Boundary-Scan Register circuits for IEEE Standard 1149.1 compliant PLDs.

BACKGROUND OF THE INVENTION

Programmable Logic Devices (PLDS) are Integrated Circuits (ICs) that are user configurable and capable of implementing digital logic operations. There are several types of PLDs, including Field Programmable Gate Arrays (FPGAs) and Complex Programmable Logic Devices (CPLDs). CPLDs typically include several function blocks that are based on the well-known programmable logic array (PLA) architecture, and include a central interconnect matrix to transmit signals between the function blocks. Signals are transmitted into and out of the interconnect matrix through input/output blocks (IOBs). The input/output function of the IOBs, the logic performed by the function blocks and the signal paths implemented by the interconnect matrix are all controlled by configuration data stored in configuration memory of the CPLD. FPGAs include configurable logic blocks (CLBs) arranged in rows and columns, IOBs surrounding the CLBs, and programmable interconnect lines that extend between the rows and columns of CLBS. Each CLB includes look-up tables and other configurable circuitry that is programmable to implement a portion of a larger logic function. The CLBs, IOBs and interconnect lines are configured by data stored in a configuration memory of the FPGA.

PLDs have become popular for implementing various logic functions in electronic systems that, in the recent past, were typically implemented by smaller (<100,000 gates) application specific integrated circuits (ASICs). Such functions include glue logic, state machines, data bus logic, digital signal processors and protocol functions. Early PLDs often provided insufficient capacity to implement these functions, so the significant investment of time and money to design, layout and fabricate an ASIC for these functions was justified. However, recent advances in semiconductor and PLD technologies have produced PLDs with the necessary speed and capacity to implement these functions in most applications. Because PLDs are relatively inexpensive and can be programmed in as little as a few hours, the expense associated with the design, layout and fabrication of ASICs became harder to justify. Further, the reprogrammability of many PLDs makes them even more attractive than ASICs because it is possible to update (reconfigure) PLDS, whereas ASICs must be replaced. As such, there is a trend toward the use of PLDs in place of ASICS in electronic systems.

Most electronic systems include multiple ICs (such as PLDS, ASICs, memory devices and processors) mounted on a printed circuit board (PCB). Each PCB includes a pattern of printed metal lines (e.g., copper tracks) formed on a board of insulating material. The ICs are typically soldered to the copper tracks at specific locations on the PCB so that the copper tracks provide signal paths between the ICs that are necessary to form the desired electronic system.

After ICs are soldered to a PCB to form an electronic system, the system is typically tested to verify that all of the ICs are properly mounted (e.g., that the copper tracks provide all required IC-to-IC connections). Early electronic systems were tested using mechanical probes (e.g., bed-of-nails fixtures) that contacted the copper tracks of the PcBs and generated test signals for verifying the interconnections between the ICs. However, steady advances in semiconductor technologies have provided highly integrated ICs mounted in packages that have hundreds of pins arranged at very small pitches. Further, trends toward smaller products have forced manufacturers to pack ICs more densely on PCBs. As a result, conventional PCB testing methods using mechanical probes (e.g., bed-of-nails fixtures) are greatly impeded for several reasons. First, to support these highly integrated ICs, modern PCBs must be formed with copper tracks having ever-narrower widths, thereby making conventional testing difficult because test nails having very small physical dimensions are required. Second, the increase in the number of pins requires an increase in the number of copper tracks per PCB, thereby requiring test equipment that is increasingly more expensive to purchase and operate. Third, the dense packing of ICs on each PCB leaves little room for probe contact. Moreover, recent PCB technologies in which surface mounted IC devices are mounted on both sides of each PCB make mechanical probing practically impossible because of the required simultaneous probe contact on both sides of a PCB.

IEEE Standard 1149.1 (Boundary-Scan) was developed to overcome the limitations of conventional mechanical PCB probe testing. IEEE Standard 1149.1 defines a four pin serial interface that drives a 16-state controller (state machine) formed in each compliant IC device. The four pins control transitions of the state machine and facilitate loading of instructions and data into the compliant IC device to accomplish pre-defined tasks. Originally, IEEE Standard 1149.1 was developed to perform a Boundary-Scan Test wherein the interconnections and IC device placement on PCBs are tested through the connection pins of the PCBs (i.e., without the need for a mechanical probe). Since its establishment, the Boundary-Scan Test has been extended to include device functional tests, self-tests and diagnostic capabilities. More recently, the Boundary-Scan Test has been modified to provide In-System Programming, whereby configuration data is transmitted into the configuration memory of a target PLD after the PLD is mounted onto a PCB.

FIG. 1 shows a simplified electronic system provided for the purpose of explaining the basic concepts of Boundary-Scan Test procedures. The simplified electronic system is formed on a PCB 100 and includes a first PLD 110 and a second PLD 120.

PCB 100 includes copper traces formed on a board of insulating material that provide signal paths between a PCB connector 101 and PLDs 110 and 120, and between PLDs 110 and 120. In addition to the copper traces that transmit normal operation signals (not shown), PCB 100 includes four traces for transmitting Boundary-Scan Test signals. These copper traces include a first trace 102 for transmitting test data-in (TDI) signals, a second trace 103 for transmitting test data-out (TDO) signals, a third trace 104 for transmitting test clock (TCK) signals, and a fourth trace 105 for transmitting test mode select (TMS) signals. Boundary-Scan data (TDI/TDO) signals are typically transmitted serially through each compliant device of a system. That is, TDI signals are transmitted on first trace 102 to first PLD 110, and pass through first PLD 110 along a line 144(1). TDO signals are transmitted from PLD 110 and received as TDI signals by second PLD 120 along a linking trace 106, and pass through second PLD 120 along a line 144(2). Finally, TDO signals are transmitted from PLD 120 to PCB connector 101 on second trace 103. In contrast to the data signals, each compliant device receives the TCK and TMS signals in a parallel manner.

Each PLD of an electronic system includes IOBs that configure the device terminals (pins) for transmitting signals to or from the PLD's programmable core logic circuitry. As shown in FIG. 1, first PLD 110 includes I/O terminals 112 that transmit/receive signals via lines 114 through respective IOBs 116 to/from programmable core logic circuit 118. Similarly, second PLD 120 includes I/O terminals 122 that transmit/receive signals via lines 124 through IOBs 126 to/from core logic circuit 128.

Unlike ASICs, the functions performed by both core logic circuit 118 and IOBs 116 of PLD 110 are determined by a user after fabrication. That is, the user determines the function or functions to be performed by the programmable interconnect and logic circuitry associated with a PLD. Similarly, the user determines which of the I/O pins will be used for input operations, and which of the I/O pins will be used for output operations. As described in additional detail below, this requires each IOB 116 to include programmable circuitry capable of performing both input and output operations.

In addition to core logic and input/output circuitry, each IC device that complies with IEEE Standard 1149.1 includes dedicated pins and hardware elements (referred to herein as Boundary-Scan architecture) for implementing Boundary-Scan Test procedures. Referring to FIG. 1, first PLD 110 includes four pins 142(1) through 142(4) that are respectively connected to trace 102 (TDI), trace 105 (TMS), trace 104 (TCK) and trace 106 (TDO). Similarly, second PLD 120 includes four pins 142(5) through 142(8) that are respectively connected to trace 106 (TDI), trace 104 (TCK), trace 105 (TMS) and trace 103 (TDO). The data and test control circuitry of the Boundary-Scan architecture provided on each compliant device utilize the signals received on the four dedicated pins. Briefly described, the data circuitry of the Boundary-Scan architecture includes a series of Boundary-Scan Register (BSR) cells associated with the IOBs 116 and 126, and Test Control circuitry. The Test Control circuitry (which is described in additional detail below) is controlled by signals transmitted on the TDI/TDO line, the TCK and TMS signals to direct data signal shifting through the BSR cells to facilitate Boundary-Scan Testing of first PLD 110 and second PLD 120.

FIG. 2 is a detailed block diagram showing an example of the basic hardware elements provided on an IEEE Standard 1149.1 compliant PLD. The basic hardware elements include a test access port (TAP) 210, a TAP controller 220, an instruction register (IR) 230, an instruction decode circuit 235, a test data register circuit 240, an output multiplexer (MUX) 250, an output flip-flop 260 and a tri-state buffer 270.

TAP 210 provides access to the test support functions build into an IEEE Standard 1149.1 compliant PLD. TAP 210 includes three input connections for receiving the test clock input (TCK) signal, the test mode select (TMS) signal, and the test data input (TDI) signal. The TCK signal allows the Boundary-Scan architecture to operate synchronously and independently of the built-in system clock provided on the PLD. The TMS signal is used to control the state of TAP controller 220, as discussed above. The TDI signal is used for serial transmission of data or instruction bits, depending upon the state of TAP controller 220. TAP 210 may also include an optional fourth input terminal for receiving a test reset input signal for asynchronous resetting of TAP controller 220. In addition to the above-mentioned input connections, TAP 210 includes an output connection through which the TDO signals are transmitted. Depending upon the state of TAP controller 220, the TDO signal is used to serially shift either instruction register or data register contents out of the PLD.

FIG. 3 is a state diagram for explaining the operation of TAP controller 220 (shown in FIG. 2). The basic function of TAP controller 220 is to generate clock and control signals required for the correct sequence of operations of instruction register 230, test data register circuit 240, output MUX 250, output flip-flop 260 and tri-state buffer 270. Specifically, TAP controller 220 control signals that facilitate loading of instructions into instruction register 230, shifting TDI data into and TDO data out of the data registers in test data register circuit 240, and performing test actions such as capture, shift and update test data. These signals are provided in accordance with the state of TAP controller 220. All state transitions (indicated as arrows in FIG. 3) within TAP controller 220 occur in accordance with the serially received TMS values (shown next to each arrow).

TAP controller 220 is initialized to a Test-Logic Reset state 301 at power up. In this state all test logic is disabled (i.e., all core logic of the PLD operates normally). TAP controller 220 will enter Test-Logic Reset state 301 from any other state when TMS is held high (logic 1) for at least five TCK pulses.

From Test-Logic Reset state 301, TAP controller 220 enters a Run-Test/Idle state 302 when TMS is held low (logic 0) for at least one TCK pulse. TAP controller 220 is placed in this state while, for example, self-test or data scan operations are performed, and remains in this state until TMS is held high.

During test procedures, TAP controller 220 either enters a '-DR' branch of the state machine (i.e., states 303 through 309), or a '-IR' branch of the state machine (i.e., states 310 through 316). From Run-Test/Idle state 302 TAP controller 220 enters the '-DR' branch when TMS is held high (logic 1) for one TCK pulse, then held low (logic zero), thereby respectively shifting to a Select DR-Scan state 303, and then to a Capture-DR state 304. Alternately, from Run-Test/Idle state 302 TAP controller 220 enters the '-IR' branch when TMS is high (logic 1) for two TCK pulses, then low (logic zero), thereby respectively shifting through Select DR-Scan state 303 to Select IR-Scan state 310, and then to a Capture-IR state 311.

When TAP controller 220 enters the '-DR' branch of the state diagram, a selected data register (or serially connected set of registers) of test data register circuit 240 is connected between TDI and TDO (see FIG. 2). Capture-DR state 304 is used to load data from, for example, an input pin of the PLD. From Capture-DR state 304, TAP controller 220 enters an Exit1-DR state 306 when TMS is held high, or enters a Shift-DR state 305 when TMS is held low. Shift-DR state 305 is used to shift previously captured data toward the TDO connector such that the data is shifted by one serially connected register per TCK pulse. TAP controller 220 remains in Shift-DR state 305 as long as TMS remains low, and enters Exit1-DR state 306 when TMS is subsequently held high. From Exit1-DR state 306, TAP controller 220 enters either a Pause-DR state 307 when TMS is held low, or enters an Update-DR state 309 when TMS is held high. Pause-DR state 307 is provided to temporarily halt a shifting process to allow, for example, synchronization between TCK and system clock signals, when needed. TAP controller 220 remains in Pause-DR state 307 until TMS is held high, at which time it enters Exit2-DR state 308. From Exit2-DR state 308, TAP controller 220 either returns to Shift-DR state 305 when TMS is held low, or enters Update-DR state 309 when TMS is held high. Once TAP controller 220 is in Update-DR state 309, data shifting to/between the selected register(s) is completed, and the data stored in the selected register(s) is passed, for example, to the output pins of the PLD. From Update-DR state 309, TAP controller 220 either returns to Run-Test/Idle state 302 when TMS is held low, or to Select-DR state 303 when TMS is held high.

In contrast to the '-DR' branch, instruction register 230 is connected between TDI and TDO when TAP controller 220 enters the '-IR' branch (states 310 through 316) of the state diagram. The '-IR' branch is used to load instructions that are used, for example, to select a data register (or serially-connected set of registers) of test data register circuit 240 for subsequent test data operations. As can be observed in FIG. 3, states 310 through 316 of the '-IR' branch are respectively similar to states 303 through 309 of the '-DR' branch, and provide similar functions with respect to instruction register 230. Therefore, these states will not be discussed in further detail.

Referring again to FIG. 2, instruction register 230 receives and stores test instructions transmitted to the PLD. When TAP controller 220 is in Shift-IR state 312 (see FIG. 3), a series of instruction registers are connected in series between the TDI and TDO connectors. The test instruction data subsequently shifted into the instruction registers defines the test data register to be addressed and the test to be performed.

FIG. 4 is a schematic diagram showing an instruction register cell 400 for storing one instruction bit in the instruction register. Instruction register cell 400 includes a multiplexer (MUX) 410, a shift register flip-flop 420 and a parallel latch 430. The selected data is transmitted to shift register MUX 410 transmits either design specific DATA (optional) or instruction data shifted from a previous cell of the instruction register in accordance with a SHIFT-IR control signal generated by the TAP controller. Shift register flip-flop 420 stores the received data in response to a CLOCK IR control signal generated by the TAP controller, and transmits the stored data to a next cell in the instruction register (or to TDO if transmitted from the last cell) and to parallel latch 430. Parallel latch 430 either stores the data from shift register flip-flop 420, or resets in response to a RESET signal. After instruction data is shifted into all of the shift register flip-flop 420, the instruction data is parallel loaded into the parallel latches 430 of each cell in response to an UPDATE-IR signal from the TAP controller. Instruction data stored in each parallel latch 430 is transmitted with information from the other cells of instruction register 230 to instruction decode circuit 235 (see FIG. 2), which generates appropriate control signals that are used to control test data register circuit 240.

Referring again to FIG. 2, test data register circuit 240 receives the TDI input signal, and includes several data registers (or groups of registers) that are connected in parallel. These data registers include two required registers (i.e., a bypass register 242 and at least one BSR cell 243) and one or more optional data registers 244. Optional registers 244 may include, for example, a device ID register 245, a user-assigned ID register 246 and an ISP configuration register 247. An output multiplexer (MUX) 248 that connects a selected one of the data registers to TDO during data shifting operations.

Bypass register 242 is a single stage shift register that provides a minimum length serial path for the test data shifting through the PLD to, for example, another IC on the PCB (both not shown) of an electronic system including the PLD.

FIG. 5 is a schematic diagram showing a conventional BSR cell 243 for storing one data bit used during Boundary-Scan Test procedures. Multiple BSR cells 243 are linked in the manner described below to form a Boundary-Scan Register (BSR) whereby test data bits are shifted along the BSR to implement Boundary-Scan Test procedures. Each BSR cell 243 includes an input multiplexer (MUX) 510, a shift register flip-flop 520, a parallel latch 530 and an output MUX 540. Input MUX 510 is controlled by a SHIFT/LOAD-DR control signal to either load SYSTEM DATA or shift TDI data from a previous cell of the BSR. The selected data is transmitted to shift register flip-flop 520 that stores the received data in response to a CLOCK DR control signal generated by the TAP controller. Shift register flip-flop 520 transmits the stored data either to a next of the BSR cell (or to TDO if transmitted from the last cell) and to parallel latch 530. Parallel latch 530 stores the data from shift register flip-flop 520 in response to an UPDATE-DR control signal from the TAP controller, and transmits this data to output MUX 540. Output MUX 540 is controlled by a MODE TEST/NORM control signal from the instruction register to either transmit SYSTEM data (during normal operation) or the contents of parallel latch 540 (during Boundary-Scan Test procedures). The signal from output MUX 540 is either transmitted to the core logic (when BSR cell 243 is associated with an input pin) or to the output pin of the PLD.

Referring again to FIG. 2, optional device ID register 244 and user-assigned ID register 245 provide binary information regarding the manufacturer, part number, version number and any user-assigned information used to identify the PLD within a system. These registers are important for verifying correct installation/replacement of the PLD, and are used, for example, to identify the PLD during ISP.

Finally, optional ISP configuration register 246 allow serial shifting of ISP data using the TDI/TDO line, and parallel shifting of this data into the configuration memory of the PLD. Each ISP configuration register 246 is constructed similar to instruction register cell 400 (see FIG. 4).

The data signals output from instruction register 230 and test data register circuit 240 are transmitted to output MUX 250, which is controlled by a SELECT SIGNAL generated by TAP controller 220. In this way TAP controller 220 controls the transmission of instruction data or test data on the TDI/TDO line. The selected data is transmitted through output flip-flop 260 and tri-state buffer 270 to the TDO connector in TAP 210.

FIG. 6 is a simplified schematic diagram showing an IOB 116 that includes a portion of a BSR formed along line 144(1) of first PLD 110 (see FIG. 1). IOB 116 includes an input buffer IB, a tri-state buffer TS and BSR cells 243 (1) through 243 (3). IOB 116 is configured by an output enable (OE) signal (which is transmitted through BSR cell 243(3)) either to receive input data signals applied to an I/O pin 112, or to transmit output data signals to I/O pin 112. When the OE signal is in a first state (e.g., low), IOB 116 is configured for receiving input signals from I/O pin 112 (i.e., tri-state buffer TS is set in a tri-state mode). In the input mode, input buffer IB transmits DATA IN signals applied to I/O pin 112 through BSR cell 243(1) and on a SYSTEM INPUT line to, for example, the PLD core logic circuit. Conversely, when the OE signal is in a second state (e.g., high), IOB 116 is configured for transmitting output signals to I/O pin 112. In the output mode, output signals transmitted on a SYSTEM OUTPUT line from, for example, the PLD core logic circuit are applied to I/O pin 112 through BSR cell 243(2) and tri-state buffer TS.

BSR cells 243(1) through 243(3) each include the data register architecture discussed above with respect to FIG. 5.

During Boundary-Scan Test procedures, Boundary-Scan Test data signals are serially transmitted through BSR cells 243(1) through 243(3) in response to the SHIFT-DR and CLOCK-DR signals generated by the TAP controller. Specifically, BSR cell 243(1) receives a TDI signal from a previous BSR cell (not shown) of the BSR on line segment 144(A). This TDI signal is shifted through multiplexer 510(1) and shift register flip-flop 520(1) and transmitted to BSR cell 243(2). Subsequently, BSR cell 243(2) shifts this TDI signal through multiplexer 510(2) and shift register flip-flop 520(2), and transmits it to BSR cell 243(3). Finally, BSR cell 243(3) shifts the TDI signal through multiplexer 510(3) and shift register flip-flop 520(3), and transmits it on line segment 144(B) to a subsequent IOB associated with the BSR.

FIG. 7 is a simplified schematic diagram showing a conventional IEEE Standard 1149.1 compliant PLD 700 in which portions of programmable core logic circuit 718 are utilized to implement two distinct logic equations. PLD 700 includes nine IOBs 116-1 through 116-9, each including three BSR cells (243-X1 through 243-X3) that are serially connected to form a BSR along line 744. The serial connections between the BSR cells of the BSR are fixed (i.e., not alterable) in the manner shown in FIG. 6. Note that the BSR is 27 BSR cells in length (nine IOBs multiplied by three BSR cells per IOB).

A problem associated with conventional IEEE Standard 1149.1 compliant ICs arises because the length (i.e., number of BSR cells) and configuration (i.e., the serial connection of the BSR cells) of the BSR is fixed by the fixed serial connection between the BSR cells. For example, referring to FIG. 7, test data must be transmitted to all 27 BSR cells of the BSR associated with PLD 700 even if test data is only needed in a small number of the BSR cells. For example, if a particular Boundary-Scan Test procedure calls for test data only in BSR cells 243-91, 243-92 and 243-93 of IOB 116-9, the procedure must also include "dummy" test data values for each of the BSR cells of IOBs 116-1 through 116-8 in order to shift the test data into the target BSR cells of IOB 116-9. This fixed BSR architecture requires that the function (i.e., input or output) of all device pins must be determined before Boundary-Scan Test procedures can be generated for a conventional IEEE Standard 1149.1 compliant PLD.

In some situations involving the use of conventional IEEE Standard 1149.1 compliant ICs, particularly those involving PLDs, the device pin functions are not known until they are established by a user. For example, again referring to FIG. 7, PLD 700 is configured by a user to implement two discrete logic functions using core logic portions 718(A) and 718(B). In this example, IOBs 116-1 and 116-9 are configured to pass input signals to portion 718(A), and IOB 116-8 is configured to pass the resulting output signal to its associated device pin. Similarly, IOBs 116-2, 116-4, 116-6 and 116-9 are configured to pass input signals to portion 718(B), and IOB 116-5 is configured to pass the resulting output signal to its associated device pin. Until these pin assignments are established by the user, the pin functions associated with pins of PLD 700 are not known. To further complicate matters, some PLDs allow reconfiguration of logic and IOBs during execution of a logic operation, thereby further complicating the process of identifying the device pin functions.

In addition, some of the device pins may not be used in a particular implementation. For example, again referring to FIG. 7, the device pin associated with IOB 116-3 is not used by either of the portions 118(A) and 118(B). However, because BSR cells 243-31, 243-32 and 243-33 are fixed in the BSR, these BSR cells must be accounted for in the Boundary-Scan Test procedure.

Moreover, data must be shifted through all BSR cells during Boundary-Scan Test procedures, even when only a few device pins are being tested. For example, assume a user wishes only to test the logic function associated with portion 718(A). In order to transmit data into the BSR cells of IOBs 116-1, 116-8 and 116-9 to perform this test, data must also be transmitted to all of the BSR cells associated with IOBs 116-3 through 116-7.

In each of the examples provided above, the problem presented by the fixed BSR is that shifting data signals through unused or non-relevant BSR cells causes delays during test procedures. When several tests are performed, these delays significantly increase the test period, thereby increasing production costs.

What is needed is a BSR cell that is programmable to facilitate removal from the BSR of an IC, thereby providing a BSR having various lengths and configurations, and thereby reducing the time required to perform Boundary-Scan Test procedures.

SUMMARY OF THE INVENTION

The present invention is directed to a Boundary-Scan register (BSR) cell that includes a bypass circuit for selectively routing data signals around the shift register flip-flop, thereby allowing selective removal of the BSR cell from a Boundary-Scan Register (BSR). Accordingly, a variable length and variable configuration BSR is formed when all BSR cells of the BSR include bypass circuits in accordance with the present invention.

A BSR cell includes a test data input (TDI) terminal for receiving TDI signals, an input multiplexer (MUX) for passing either the TDI signals or system data signals to a shift register flip-flop, and a test data output (TDO) terminal from which TDO signals are transmitted to a subsequent BSR cell in a BSR. In accordance with a first aspect of the present invention, the BSR cell also includes a bypass MUX having a first input terminal connected to the TDI terminal, a second input terminal connected to an output terminal of the shift register flip-flop, and an output terminal connected to the TDO terminal. The BSR cell operates in a "normal" mode (i.e., included in the BSR) when the bypass MUX is controlled to pass data signals output from the shift register flip-flop to the TDO terminal. In contrast, the BSR cell is selectively bypassed (i.e., removed from the BSR) when the bypass MUX is controlled to pass the TDI signal to the TDO terminal.

The BSR cell also includes a system data input terminal from which the system data signals are passed to the input multiplexer (MUX), a system data output terminal from which data signals are transmitted to system circuitry and to a first input terminal of an output MUX, and a parallel latch flip-flop having an input terminal connected to the output terminal of the shift register flip-flop and an output terminal connected to a second input terminal of the output MUX. In accordance with a second aspect of the present invention, the BSR cell also includes a mode control MUX having a first input terminal connected to receive a MODE signal generated by a Boundary-Scan TAP controller, a second input terminal connected to an OFF (disable) signal source, and an output terminal connected to the select input terminal of the output MUX. When the BSR cell operates in the "normal" mode (i.e., included in the BSR), the mode control MUX is controlled to pass the MODE signal to the output MUX, thereby controlling the output MUX to pass either system data input signals or test data signals from the parallel latch flip-flop to the system circuitry. In contrast, when the BSR cell is selectively bypassed (i.e., removed from the BSR), the mode control MUX is controlled to pass the OFF signal to the output MUX, thereby causing the output MUX to ignore the MODE signal.

DETAILED DESCRIPTION OF THE DRAWINGS

The present invention is directed to Boundary-Scan Registers (BSRs), and particularly to BSR cells utilized in the input/output blocks (IOBS) of PLDs, such as FPGAs and CPLDs. Although the BSR cell according to the present invention is described below with reference to PLDs, the disclosed circuit may be beneficially utilized in other types of ICs. Therefore, the appended claims should not necessarily be limited to PLDs.

Figure 1:
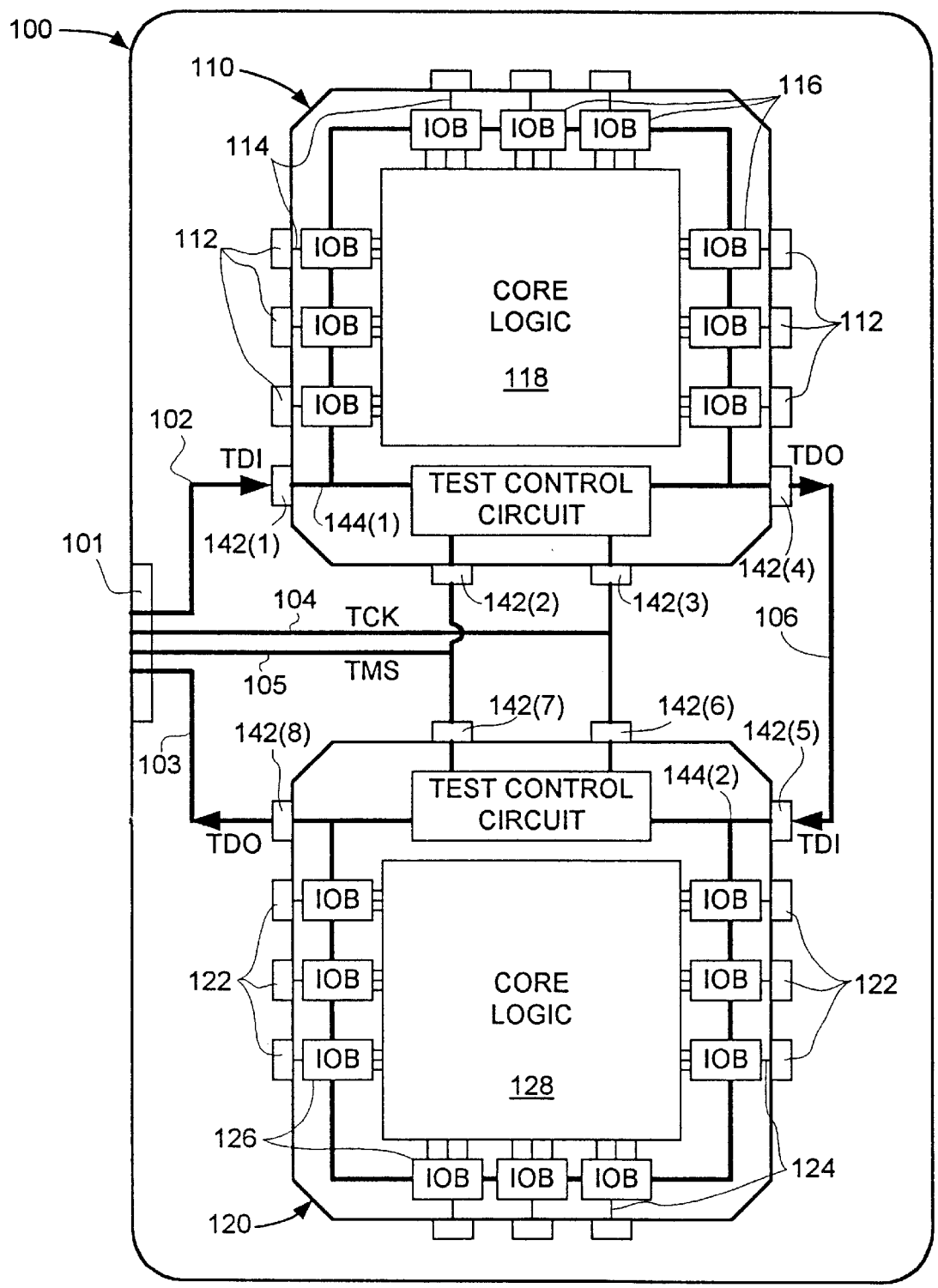
FIG. 1 is a simplified diagram showing an electronic system incorporating IEEE Standard 1149.1 compliant ICs.
Figure 2:
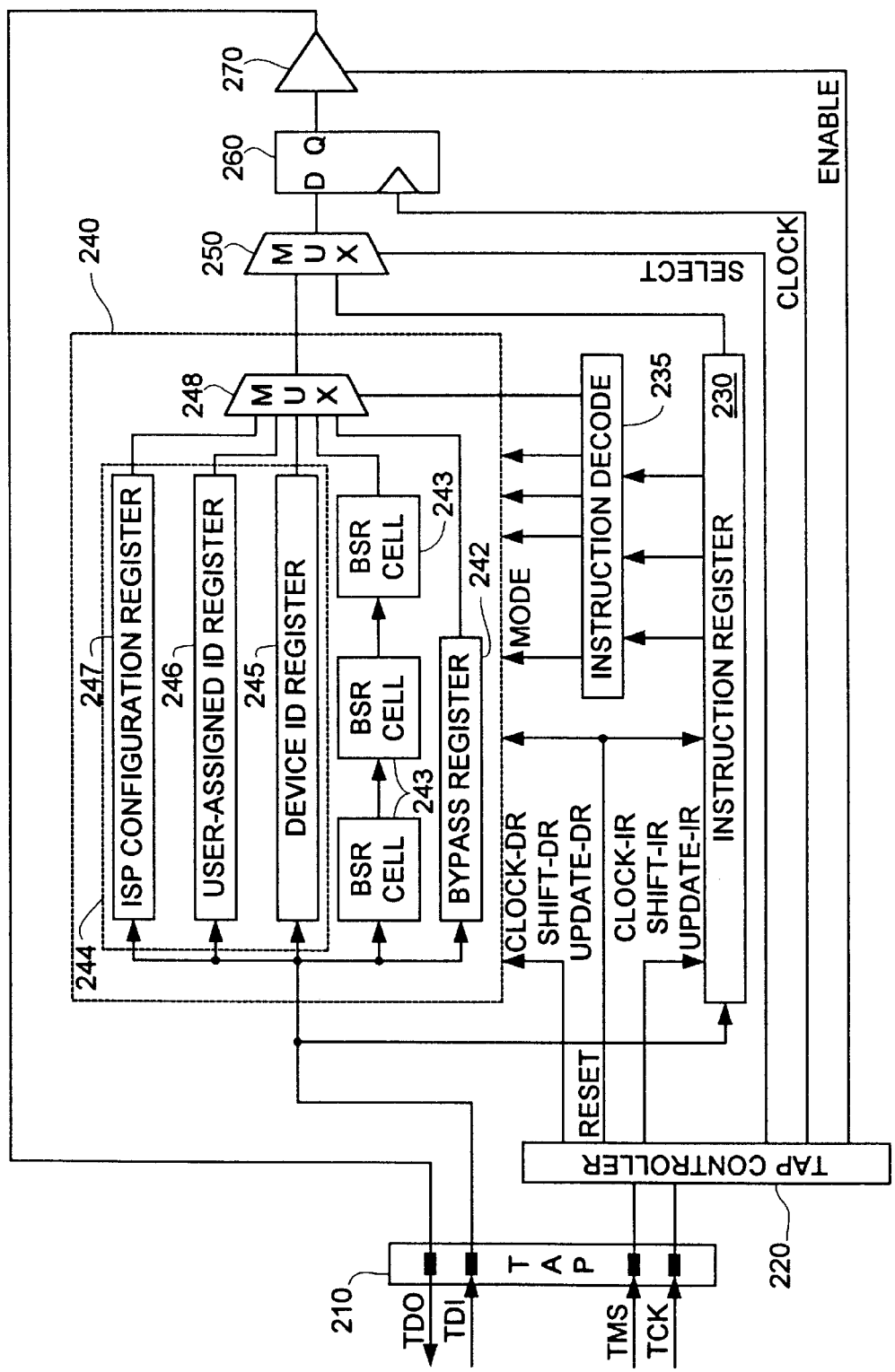
FIG. 2 is a diagram showing an example of a conventional Boundary-Scan architecture found on an IEEE Standard 1149.1 compliant PLD.
Figure 3:
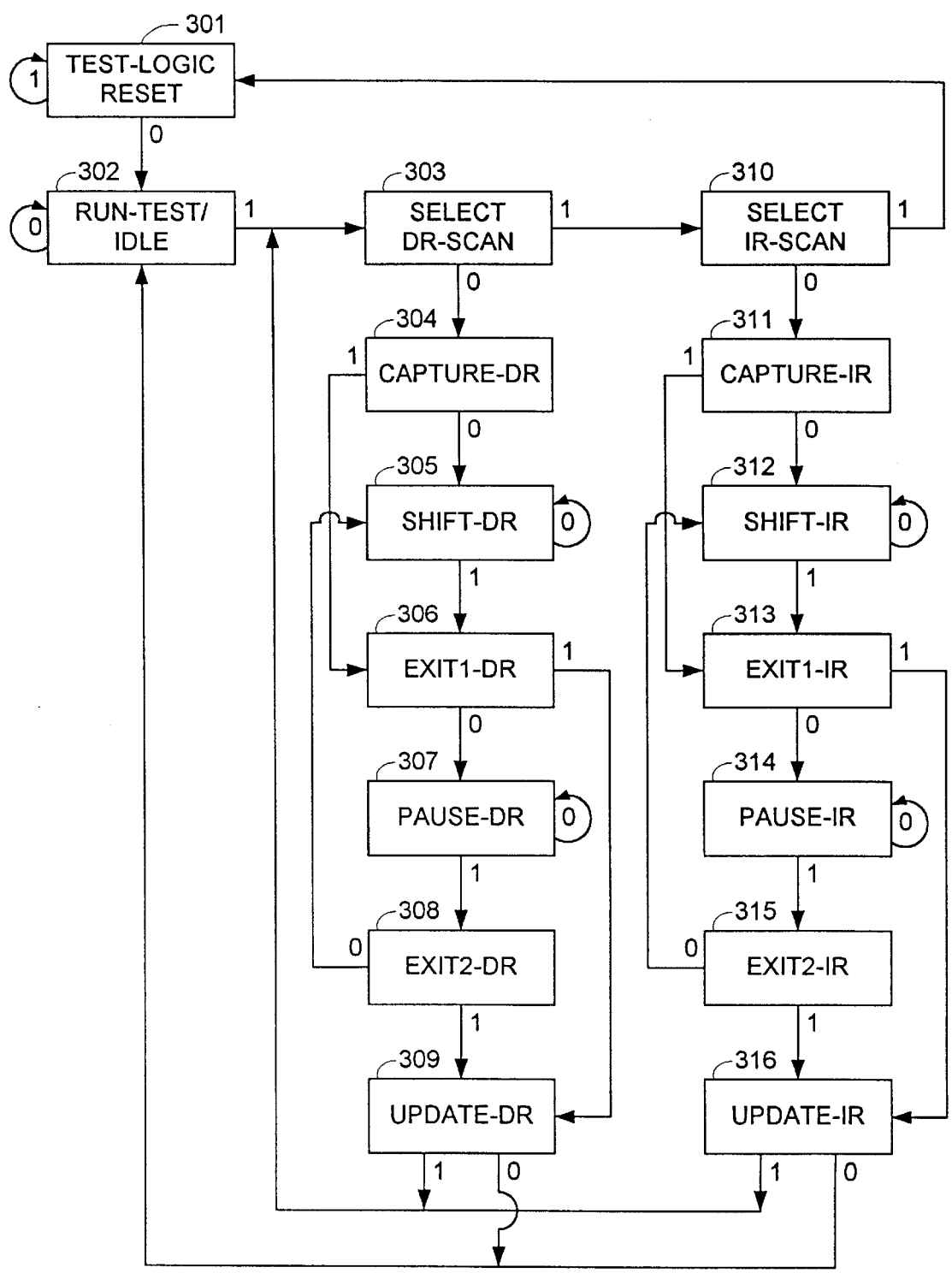
FIG. 3 is a block diagram showing the various states of a state machine associated with the TAP controller of the conventional Boundary-Scan architecture.
Figure 4:
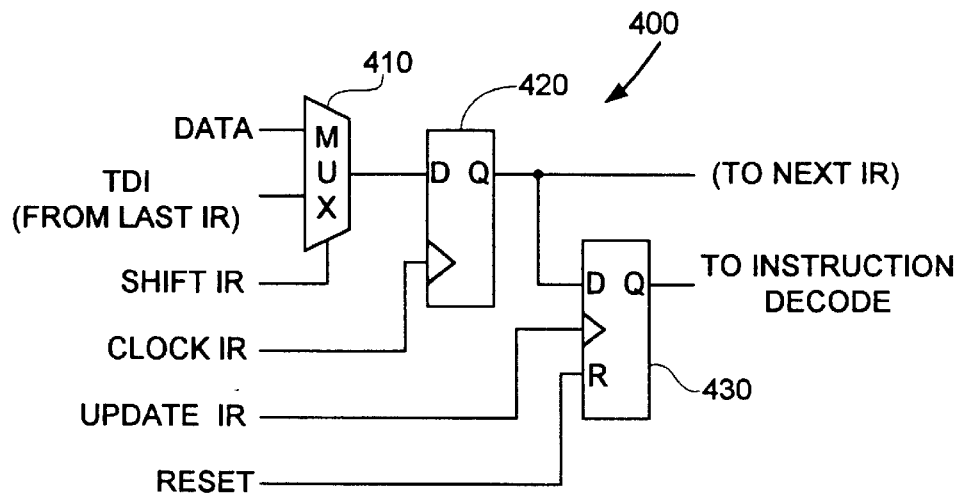
FIG. 4 is a simplified schematic diagram showing an instruction register cell associated with the conventional Boundary-Scan architecture.
Figure 5:
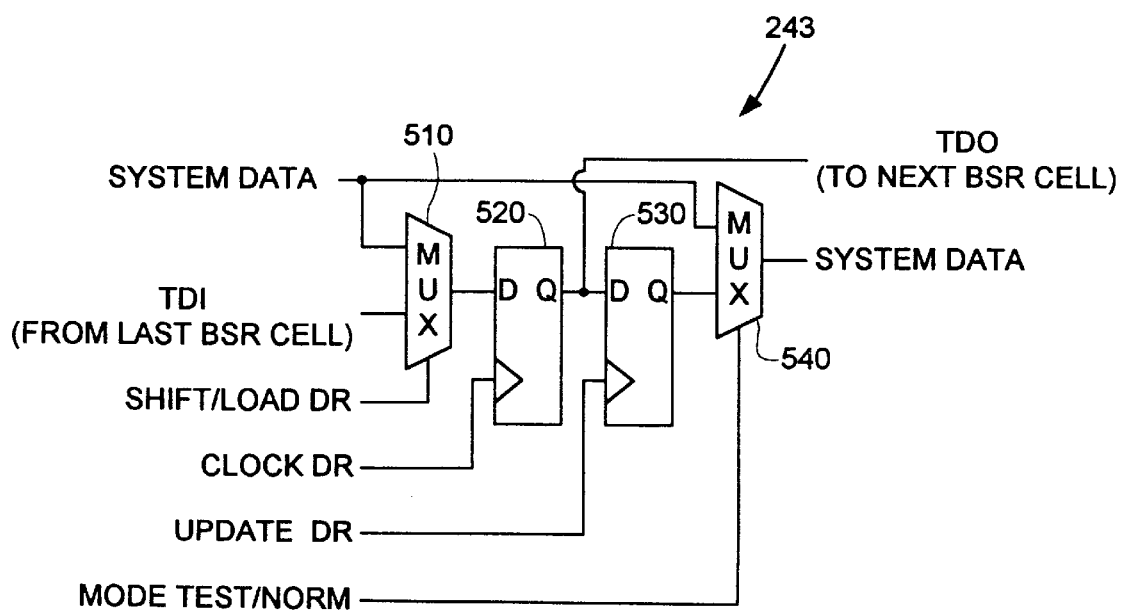
FIG. 5 is a simplified schematic diagram showing a conventional data register cell associated with the Boundary-Scan architecture.
Figure 6:
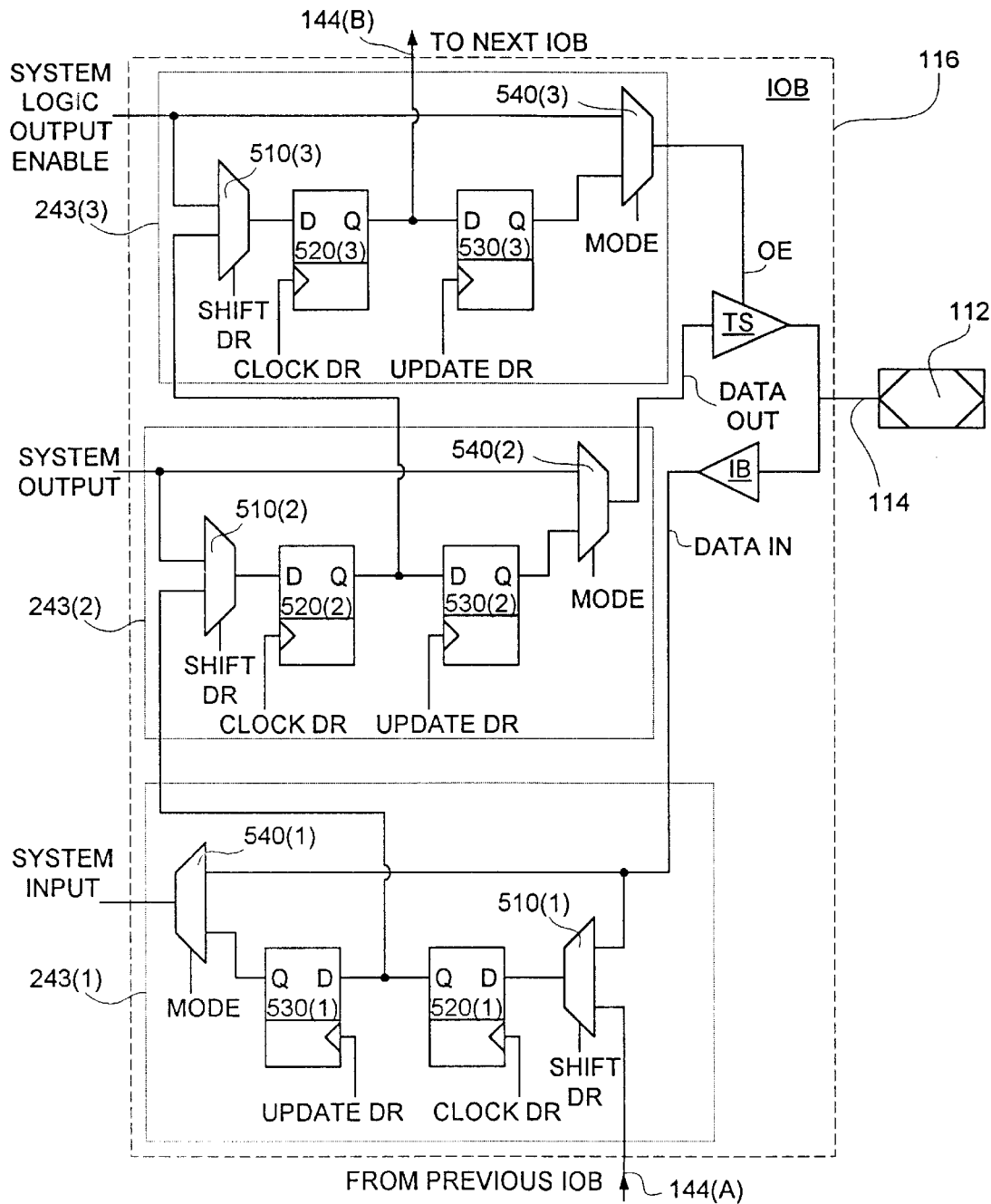
FIG. 6 is simplified schematic diagram showing a conventional IOB of an IEEE Standard 1149.1 compliant PLD.
Figure 8:
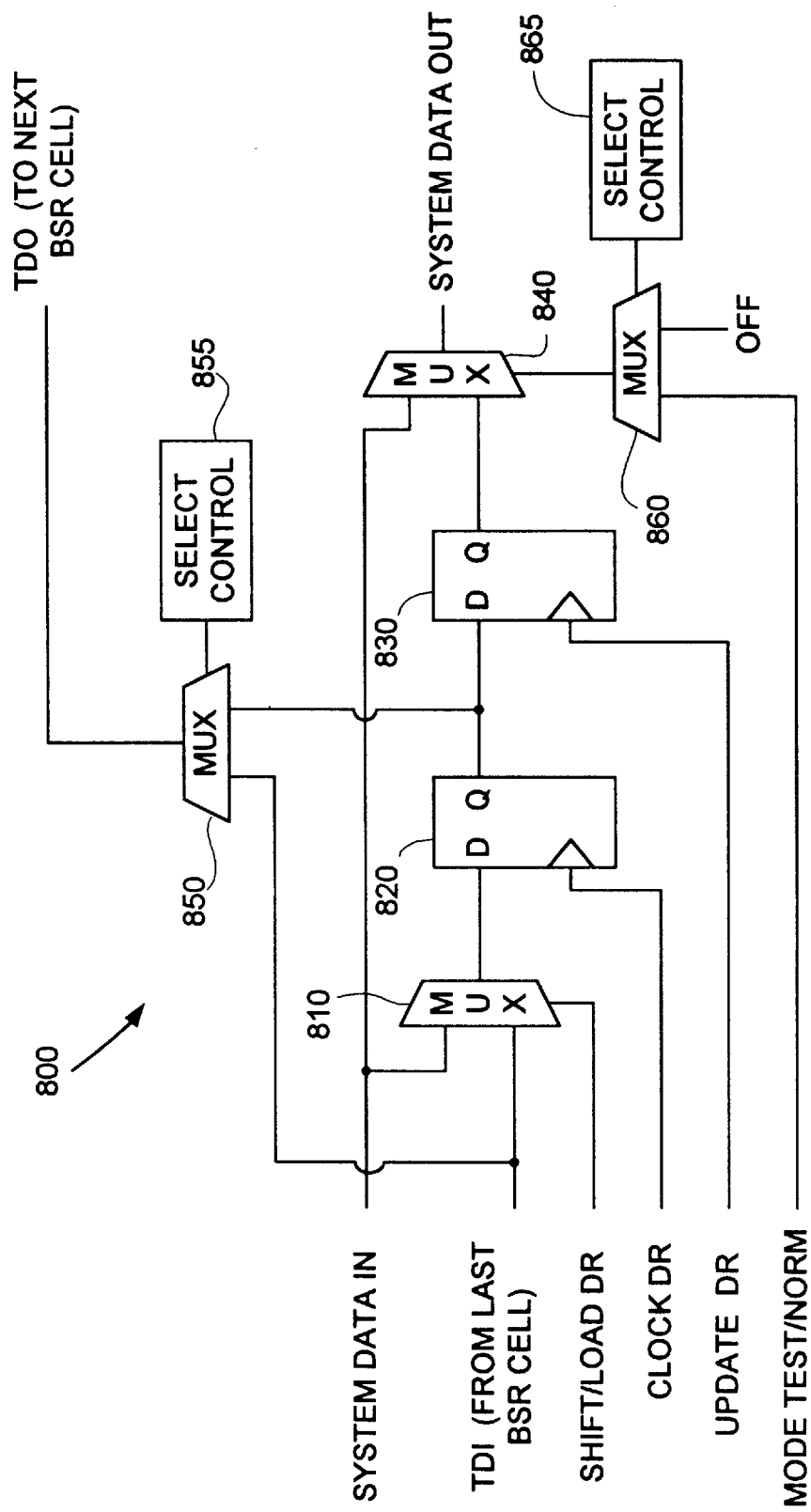
FIG. 8 is a block diagram showing a BSR cell in accordance with a first embodiment of the present invention.

FIG. 8 is a block diagram showing a BSR cell 800 in accordance with a first embodiment of the present invention. Typically, BSR cell 800 is incorporated into the Boundary-Scan architecture of a host IC that is similar to that shown in FIG. 2 (i.e., wherein BSR cell 800 replaces conventional BSR cell 243). Similar to conventional cell 243 (see FIG. 6), BSR cell 800 includes a test data input (TDI) terminal, a SYSTEM DATA IN terminal, an input multiplexer (MUX) 810, a shift register flip-flop 820, a test data output (TDO) terminal, a parallel latch 830, an output MUX 840 and a SYSTEM DATA OUT terminal. Input MUX 810 is controlled by a SHIFT/LOAD-DR control signal to either pass signals from the SYSTEM DATA IN terminal (e.g., from core logic of the host IC) or signals from the TDI terminal (e.g., from a previous BSR cell in the BSR chain). The selected data is transmitted to shift register flip-flop 820 that stores the received data in response to a CLOCK DR control signal generated by the TAP controller. Shift register flip-flop 820 transmits the stored data to parallel latch 830 and, in accordance with a first aspect of the present invention (discussed in detail below), to a bypass circuit (MUX) 850. Parallel latch 830 stores the data from shift register flip-flop 820 in response to an UPDATE-DR control signal from the TAP controller, and transmits this data to output MUX 840. In accordance with a second aspect of the present invention (discussed in detail below), output MUX 840 is controlled by a mode control circuit (MUX) 860.

In accordance with the first aspect of the present invention, bypass MUX 850 is controlled by a select control circuit 855 to selectively bypass BSR cell 800 in a BSR. Bypass MUX 850 includes a first input terminal connected to the TDI terminal, a second input terminal connected to the output terminal of shift register flip-flop 820, and an output terminal connected to the TDO terminal that is used to shift data signals along the BSR. When select control circuit 855 transmits a first (e.g., high) signal, bypass MUX 850 passes signals output from shift register flip-flop 820 to the TDO terminal, thereby causing BSR cell 800 to operate in a manner consistent with conventional BSR cell 243 (described above). Conversely, when select control circuit 855 transmits a second (e.g., low) signal, bypass MUX 850 passes signals directly from the TDI terminal, thereby bypassing input MUX 810 and shift register flip-flop 820. In effect, by programming bypass MUX 850 to pass data signals directly from the TDI terminal to the TDO terminal, a user is able to selectively remove BSR cell 800 from a BSR, thereby allowing the user to adjust the length and change the configuration of the BSR.

In accordance with the second aspect of the present invention, mode control MUX 860 is controlled by a select control circuit 865 to control signals transmitted on the SYSTEM DATA OUT terminal of BSR cell 800. When select control circuit 865 transmits a first (e.g., high) signal, mode control MUX 860 passes a MODE TEST/NORM control signal to the select input terminal of output MUX 840. In accordance with the state of the MODE TEST/NORM control signal, output MUX 840 either passes SYSTEM data (during normal operation) or the contents of parallel latch 840 (during Boundary-Scan Test procedures) to the SYSTEM DATA OUT terminal. When select control circuit 865 transmits a second (e.g., low) signal, mode control MUX 860 passes an OFF (disable) signal to the select input terminal of output MUX 840, thereby isolating output MUX 840 from the MODE TEST/NORM signal. In one embodiment, the OFF signal is a constant logic "0" such that output MUX 840 permanently connects the SYSTEM DATA IN terminal (which is not in use) to the SYSTEM DATA OUT terminal.

In the present embodiment, bypass circuit 850 and mode control circuit 860 are implemented by multiplexers. Those of ordinary skill in the art would recognize that other switching structures can be used to provide the switching function performed by these multiplexers.

Also in the present embodiment, select control circuits 855 and 865 may be implemented by memory cells (such as SRAM, DRAM, EPROM, EEPROM, fuse or antifuse elements). Select control signals can also be generated from core circuitry (not shown) of a host IC, or transmitted from a source located off of the host IC. Finally, select control circuits 855 and 865 can be combined such that the select control signals transmitted to bypass MUX 850 and mode control MUX 860 have a common source (e.g., a common SRAM cell).

Figure 9:
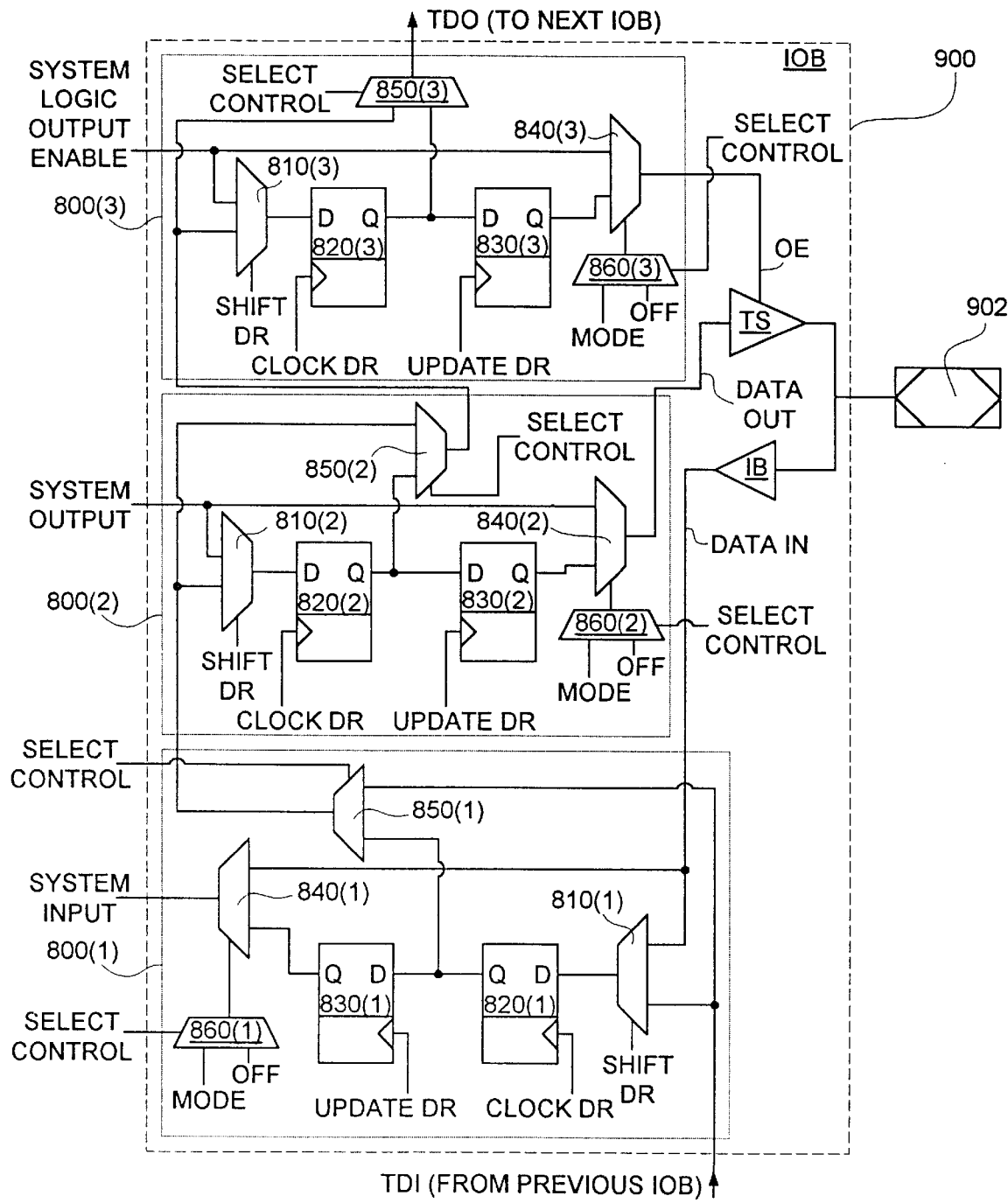
FIG. 9 is a block diagram showing an IOB in accordance with a second embodiment of the present invention.

FIG. 9 is a block diagram showing an IOB 900 in accordance with a second embodiment of the present invention. IOB 900 is typically formed on a host PLD (not shown) and controls an I/O pin 902 of the host PLD. IOB 900 includes three serially-connected BSR cells 800(1), 800(2) and 800(3) that form a portion of a BSR on the host PLD, each BSR cell including the components discussed above with reference to FIG. 8. BSR cell 800(1) receives TDI signals from a previous IOB (not shown) in the BSR and a DATA IN signal from input buffer IB, and outputs a SYSTEM INPUT signal that is transmitted to, for example, the core logic circuit of the host PLD. BSR cell 800(2) receives data signals from BSR cell 800(1) and a SYSTEM OUTPUT signal from the core logic circuit, and generates a DATA OUT signal that is transmitted to tri-state buffer TS. Finally, BSR cell 800(3) receives data signals from BSR cell 800(2) and a SYSTEM LOGIC OUTPUT ENABLE signal from the core logic circuit, and generates an output enable (OE) signal that is transmitted to tri-state buffer TS. Tri-state buffer TS is controlled in response to the OE signal to transmit the DATA OUT signals to I/O pin 902.

Similar to conventional IOB 116 (discussed above), IOB 900 is configured during normal operation by output enable (OE) signal (which is transmitted through BSR cell 800(3)) either to receive input data signals applied to I/O pin 902, or to transmit output data signals to I/O pin 902. When the OE signal is in a first state (e.g., low), IOB 900 is configured for receiving input signals from I/O pin 902 (i.e., tri-state buffer TS is set in a tri-state mode). In the input mode, input buffer IB transmits DATA IN signals applied to I/O pin 902 through BSR cell 800(1) and on a SYSTEM INPUT line to, for example, the core logic circuit of the host PLD. Conversely, when the OE signal is in a second state (e.g., high), IOB 900 is configured for transmitting output signals to I/O pin 902. In the output mode, output signals transmitted on a SYSTEM OUTPUT line from, for example, the core logic circuit, are applied to I/O pin 902 through BSR cell 800(2) and tri-state buffer TS.

Figure 10A:
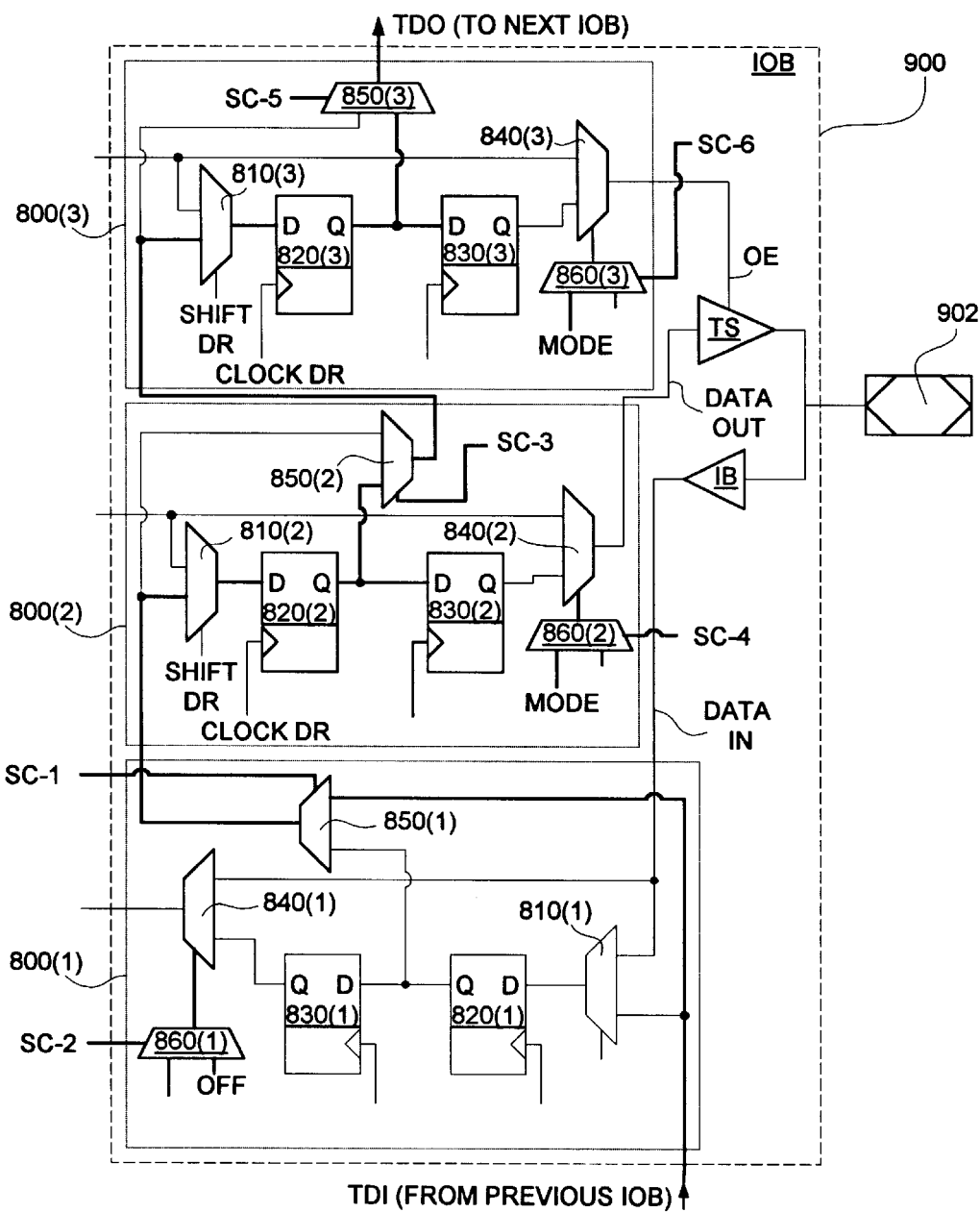
FIGS. 10A, 10B and 10C are block diagrams showing various configurations of the IOB shown in FIG. 9.
Figure 10B:
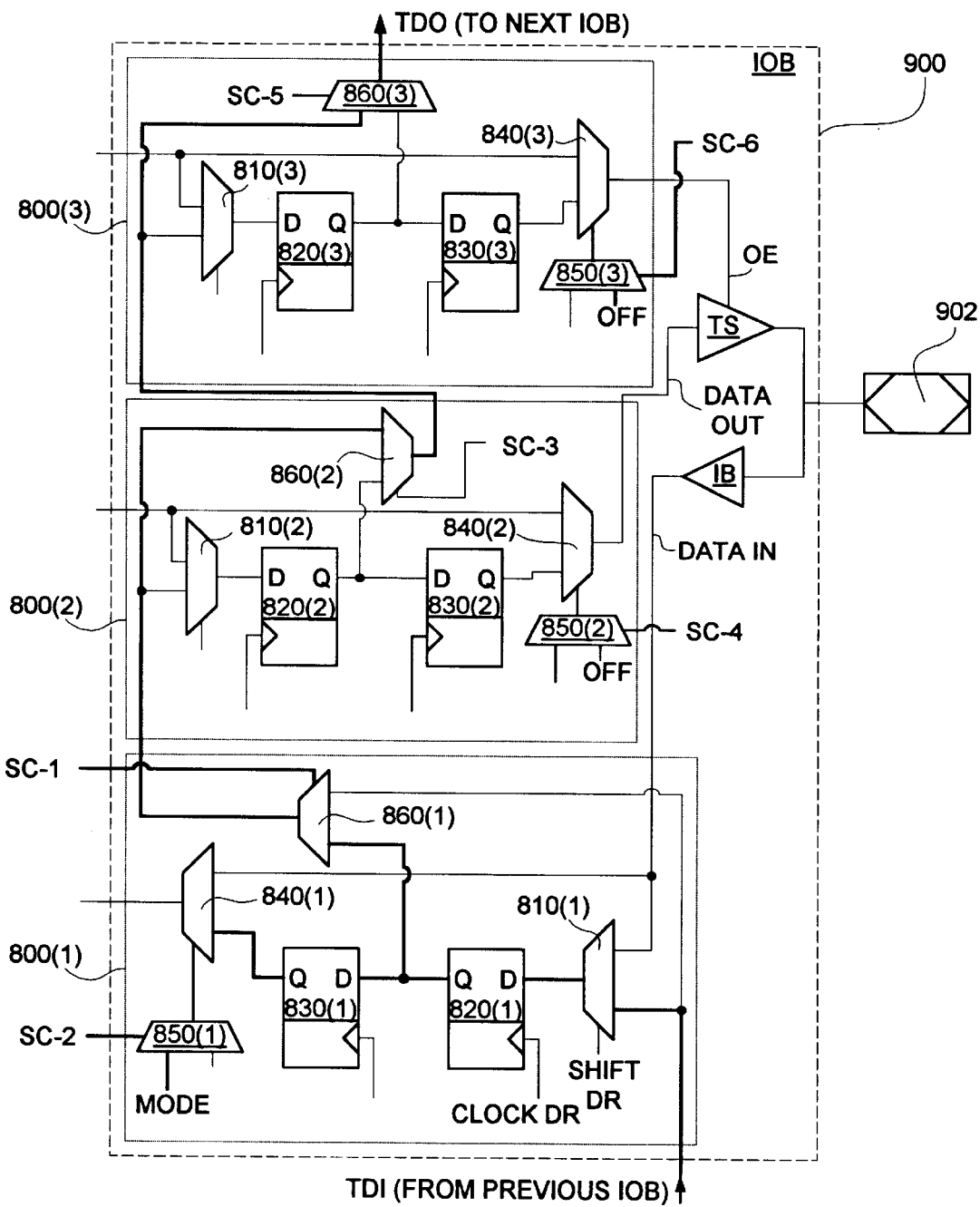
Figure 10C:
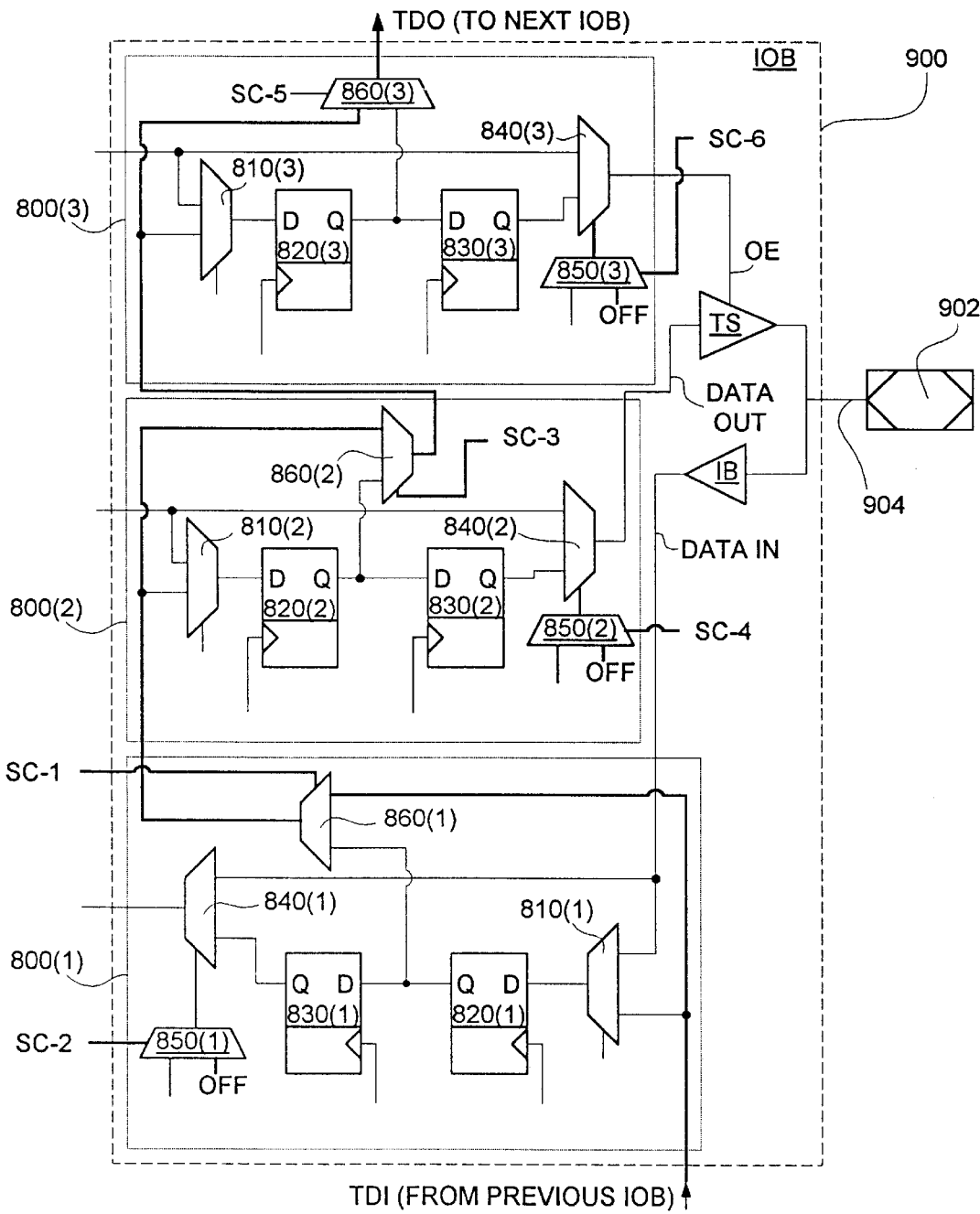

FIGS. 10A, 10B and 10C are block diagrams showing examples of how IOB 900 is configured to perform Boundary-Scan Test procedures. These examples illustrate how the bypass circuitry of BSR cell 800 is selectively configured to bypass unused BSR cells in IOB 900, thereby adjusting the length of a BSR incorporating IOB 900.

FIG. 10A shows a first example in which IOB 900 is configured to perform Boundary-Scan Test procedures associated with IOB output operations. As discussed above, when IOB 900 is in the output mode, signals received on the DATA IN line are ignored (i.e., not passed to the core logic circuit of the host PLD). Therefore, BSR cell 800(1) can be bypassed (i.e., removed from the BSR) without impeding Boundary-Scan Test procedures. To bypass BSR cell 800(1), in accordance with the first aspect of the present invention, select control signal SC-1 is set such that bypass MUX 850(1) passes the TDI signal received from a previous BSR cell in the BSR directly to IOB 800(2). In addition, in accordance with the second aspect of the present invention, select control signal SC-2 is set such that mode control MUX 860(1) applies the OFF signal to the select input of output MUX 840(1).

In contrast to BSR cell 800(1), bot h BSR cell 800(2) and 800(3) are accessed during Boundary-Scan Test procedures when IOB 900 is conf igured for output operations. Accordingly, select control signal SC-3 is set such that bypass MUX 850(2) passes the shifted data signal received from shift register flip-flop 820(2) to BSR cell 800(3), and select control signal SC-5 is set such that bypass MUX 850(3) passes the shifted data signal received from shift register flip-flop 820(3) to the TDO terminal. In addition, in accordance with the second aspect of the present invention, select control signals SC-4 and SC-6 are set such that mode control MUXes 860(2) and 860(3) apply MODE signals to the select inputs of output MUXes 840(2) and 840(3), respectively. With this configuration, test data is shifted only into BSR cells 800(2) and 800(3), thereby effectively removing BSR cell 800(1) from the BSR.

FIG. 10B shows a second example in which IOB 900 is configured to perform Boundary-Scan Test procedures associated with IOB input operations. As discussed above, when IOB 900 is in the input mode, signals received on the DATA OUT line are ignored. Therefore, BSR cells 800(2) and 800(3) can be bypassed (i.e., removed from the BSR) without impeding Boundary-Scan Test procedures. This bypass i s achieved by setting select control signals SC-3 and SC-5 such that bypass MUXes 850(2) and 850(3) pass data signals received from BSR cell 800(1) directly to the TDO line. In a ddition, in accordance with the second aspect of the present invention, select control signals SC-4 and SC-6 are set such that mode control MUXes 860(2) and 860(3) apply OFF signals to the select inputs of output MUXes 840(2) and 840(3).

In contrast, BSR cell 800(1) is accessed during Boundary-Scan Test procedures when IOB 900 is configured for input operations. Specifically, select control signal SC-3 is set such that bypass MUX 850(1) passes the shifted data signal received from the TDI line to BSR cell 800(2). In addition, in accordance with the second aspect, select control signal SC-2 is set such that mode control MUX 860(1) applies a MODE signal to the select input of output MUX 840(1). With this configuration, test data is shifted only into BSR cell 800(1), thereby effectively removing BSR cells 800(2) and 800(3) from the BSR.

FIG. 10C shows a third example in which IOB 900 is configured for total bypass during Boundary-Scan Test procedures. When an IOB is not used for input or output operations, all of the BSR cells of that IOB can be bypassed. Accordingly, select control signals SC-1, SC-3 and SC-5 are set such that bypass MUXes 850(1), 850(2) and 850(3) pass the TDI signal received from a previous BSR cell in the BSR directly to the TDO line. In addition, select control signals SC-2, SC-4 and SC-6 are set such that mode control MUXes 860(1), 860(2) and 860(3) apply the OFF signal to the select inputs of output MUXes 840(1), 840(2) and 840(3), respectively. This configuration effectively removes IOB 900 from the BSR of a host PLD by passing test data signals from a previous IOB directly to a subsequent IOB in the BSR.

Figure 11A:
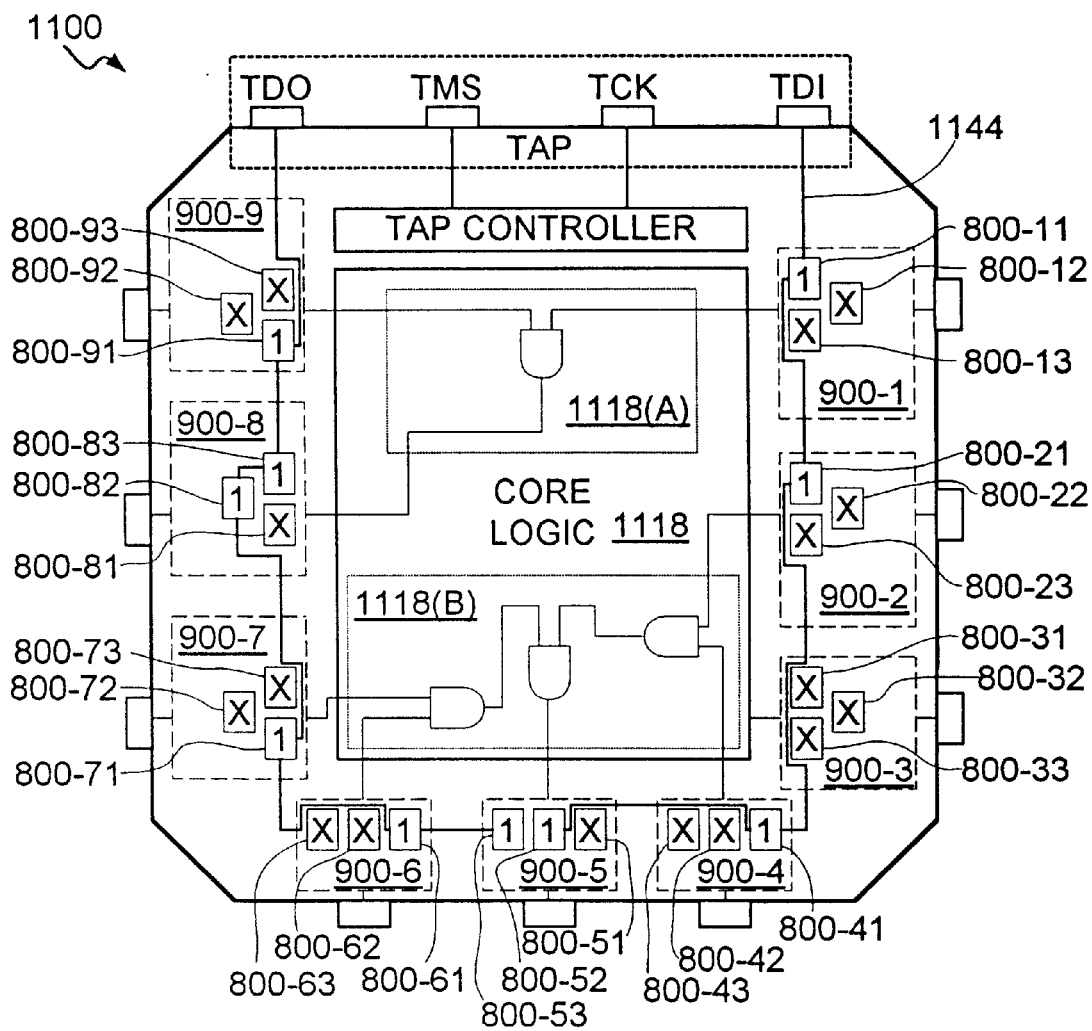
FIGS. 11A and 11B are simplified diagrams showing PLDs incorporating a BSR in accordance with a third embodiment of the present invention.
Figure 11B:
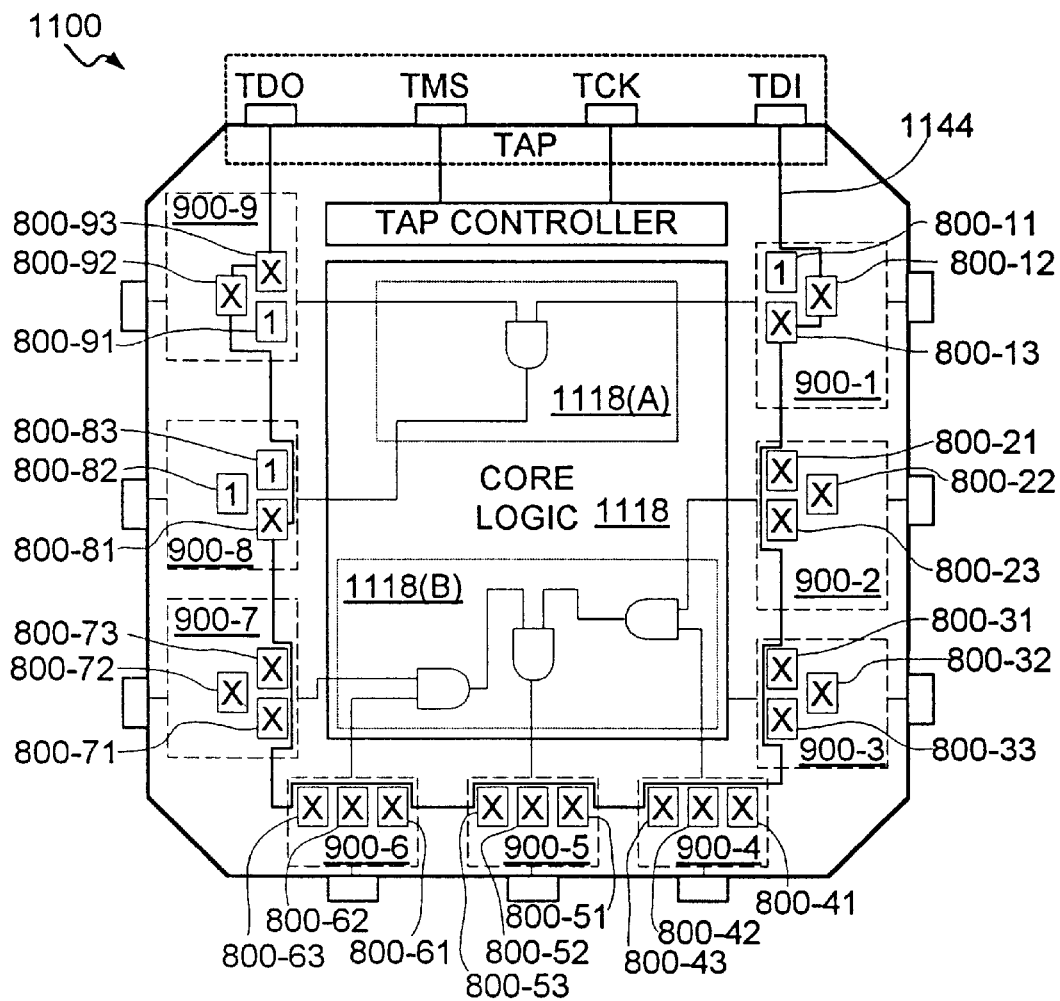

FIGS. 11A and 11B are simplified diagrams showing a PLD 1100 incorporating a BSR formed along line 1144 that has a variable length and alterable configuration in accordance with a third embodiment of the present invention. PLD 1100 is, for example, an FPGA or a CPLD that includes IOBs 900-1 through 900-9 for transmitting signals between a programmable core logic circuit 1118 and a plurality of I/O pins. Each of the IOBs 900-1 through 900-9 includes the I/O circuitry discussed above with respect to FIG. 9. In particular, each IOB includes three BSR cells 800-X1, 800-X2 and 800-X3 ("X" being the IOB number), each BSR cell including the components discussed above with reference to FIG. 8. As such, the BSR formed along line 1144 has a maximum length of 27 BSR cells (nine IOBs multiplied by three BSR cells per IOB).

Figure 7:
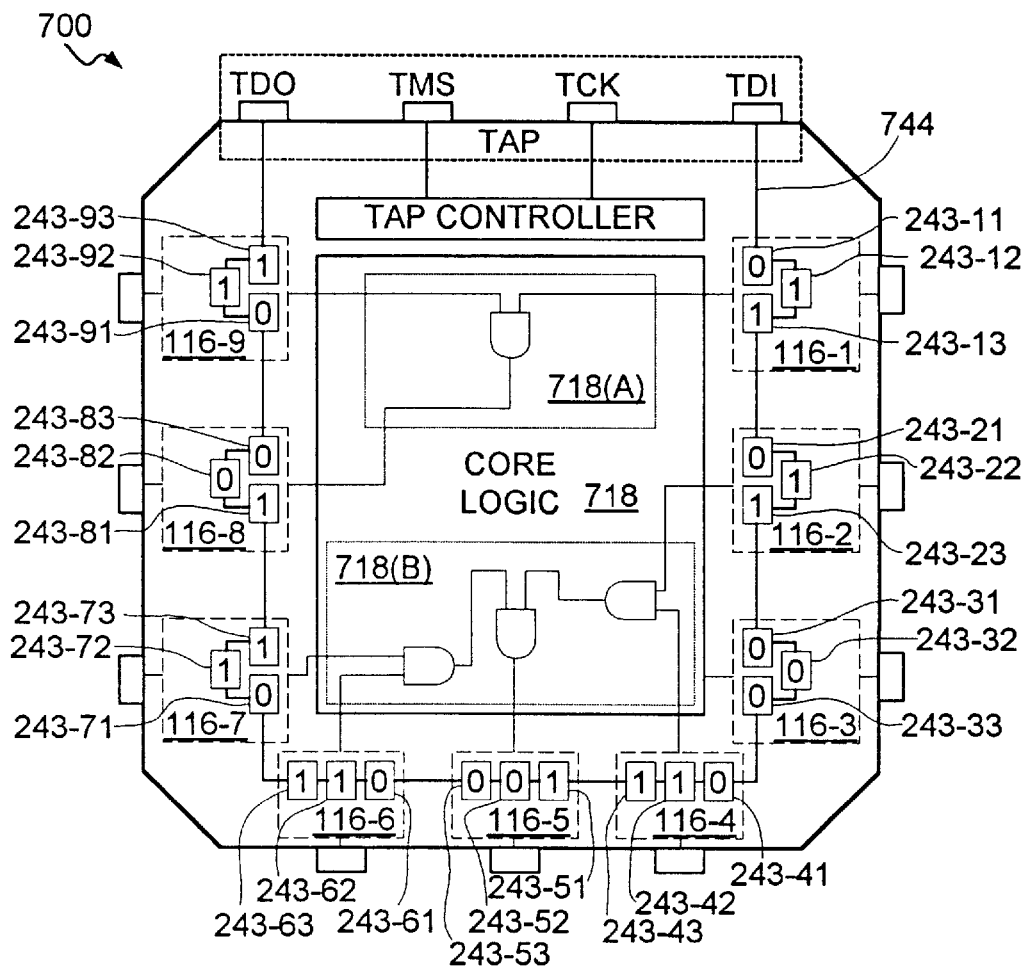
FIG. 7 is a simplified diagram showing an example of a conventional IEEE Standard 1149.1 compliant PLD after configuration.

FIGS. 11A and 11B illustrate examples of how the BSR of PLD 1100 is configured during Boundary-Scan Test procedures. In particular, these examples illustrate how the bypass circuitry of BSR cell 800 is selectively configured to shorten the BSR of PLD 1100 such that unused or non-relevant BSR cells are effectively removed from the BSR during Boundary-Scan Test procedures. Similar to the prior art example discussed above with respect to FIG. 7, core logic circuit 1118 of PLD 1100 is utilized in these examples to implement two distinct logic functions referred to herein as first logic function 1118(A) and second logic function 1118(B). First logic function 1118(A) receives input signals from the I/O pins associated with IOBs 900-1 and 900-9, and transmits an output signal to the I/O pin associated with IOB 900-8. In addition, second logic function 1118(B) receives input signals from the I/O pins associated with IOBs 900-2, 900-3, 900-6 and 900-7, and transmits an output signal to the I/O pin associated with IOB 900-5. The I/O pin associated with IOB 900-4 is not utilized by neither first logic function 1118(A) or second logic function 1118(B). In FIGS. 11A and 11B, BSR cells that remain connected in the BSR are identified with a "1", whereas BSR cells that are bypassed are identified with an "X".

Referring to FIG. 11A, PLD 1100 is configured to perform Boundary-Scan Test procedures in accordance with a first example. In accordance with the first example, BSR cells that are used by neither first logic function 1118(A) nor second logic function 1118(B) are effectively removed from the BSR by programming the bypass circuits of these BSR cells to pass signals directly from their TDI terminals to their TDO terminals. For example, referring to first logic function 1118(A) in FIG. 11A, IOBs 900-1 and 900-9 are configured for data input (i.e., in the manner shown in FIG. 10B) such that BSR cells 800-12, 800-13, 800-92 and 800-93, which are related to output signal generation, are effectively removed from the BSR. Similarly, IOB 900-8 is configured for data output (in the manner shown in FIG. 10A) such that BSR cell 800-81 is bypassed. Turning to second logic function 1118(B), IOBs 9002, 900-3, 900-5, 900-6 and 900-7 are similarly configured for data input and data output operations, whereby BSR cells 800-22, 80023, 800-42, 800-43, 800-51, 800-62, 800-63, 800-72 and 800-73 are removed from the BSR. Finally, because IOB 900-3 is utilized by neither first logic function 1118(A) nor second logic function 1118(B), BSR cells 800-31, 800-32 and 800-33 are all bypassed (as shown in FIG. 10C). Therefore, in accordance with the configuration of the first example shown in FIG. 11A, the variable length BSR of PLD 1100 has an effective length of 10 BSR cells, which is less than half of the maximum length (27 BSR cells) of the BSR. This reduced-length BSR facilitates significantly faster Boundary-Scan Test procedures over conventional fixed-length BSRs because significantly less data is required.

FIG. 11B shows a second example in which PLD 1100 is further configured to perform Boundary-Scan Test procedures associated only with logic function 1118(A). As discussed above, under certain circumstances it is desirable to limit a particular Boundary-Scan Test procedure to a discrete logic function implemented on a PLD. In accordance with the second example, all BSR cells that are n ot used first logic function 1118(A) are effectively removed from the BSR. Accordingly, referring to first logic function 1118(A) in FIG. 11A, IOBs 900-1 and 900-9 are configured for data input and IOB 900-8 is configured for data output as in the first example (discussed above with reference to FIG. 11A). However, in contrast to the first example, IOBs 900-2, 900-3, 900-5, 900-6 and 900-7 900-8 associated with second logic function 1118(B) are configured like IOB 900-3 (i.e., all BSR cells of these IOBs are bypassed as in FIG. 10C).

Therefore, in accordance with the configuration of the second example shown in FIG. 11B, the variable length BSR of PLD 1100 has an effective length of 4 BSR cells (i.e., BSR cells 800-11, 800-82, 800-83 and 800-91), which is less than 20% of the maximum length (27 BSR cells) of the BSR, thereby further increasing the speed of associated Boundary-Scan Test procedures.

Figure 12:
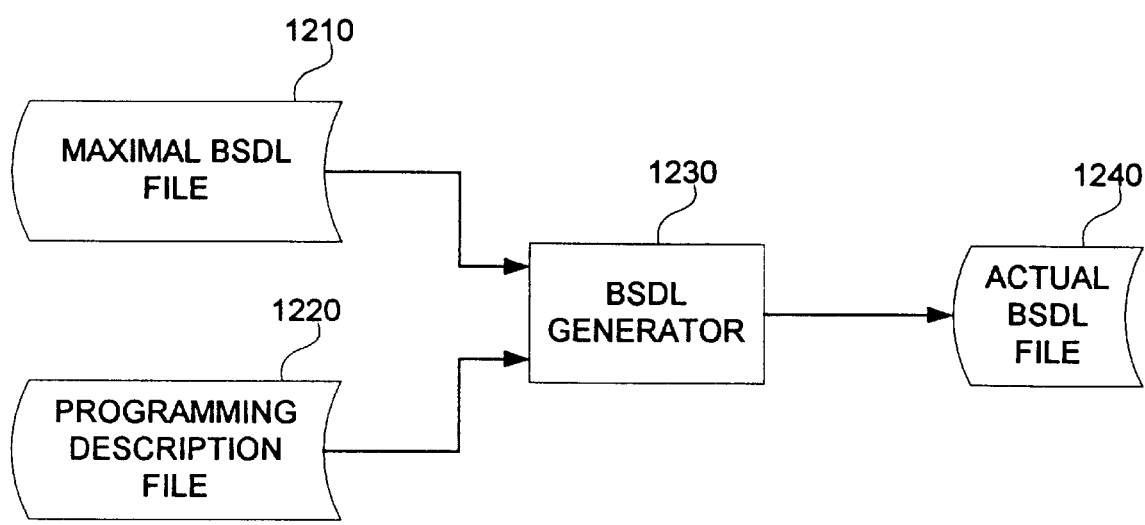
FIG. 12 is a flow diagram showing a process for preparing Boundary-Scan Test procedures for PLDs incorporating the BSR in accordance with the third embodiment.

FIG. 12 is a flow diagram showing a process for preparing Boundary-Scan Test procedures for PLDs incorporating the variable-length BSR in accordance with the third embodiment. Typically, a Boundary-Scan Test procedure uses what is called a Boundary-Scan Description Language (BSDL) file to describe the characteristics of the Boundary-Scan architecture on the target device. The variable-length BSR of PLD 1100 would also necessitate the generation of the BSDL files "on-the-fly" that include configuration information corresponding to the "shortened" BSR us ed in the procedure. To generate BSDL files "on-the-fly", it is necessary to access a maximal BSDL file 1210 describing the maximum BSR architecture and to intercept and interpret the target PLD's programming description file 1220 (typically a JEDEC JESD3-C file). The contents of the programming description file 1220 would then be interpreted by a BSDL generator 1230 to extract the BSR configuration. The BSR configuration would then be used to generate an "actual" BSDL file 1240 describing that BSR configuration that includes only the active elements of the BSR.

Although the present invention has been described in conside rable detail with reference to certain preferred embodiments thereof, one of ordinary skill would recognize that several variations to the disclosed embodiments are possible. For example, as discussed above, the bypass circuitry and mode control circuitry utilized in BSR cell 800 may be implemented by switching circuitry other than multiplexers. For instance, referring to FIG. 8, mode control MUX 840 may be replaced by a tri-state buffer connected to the output terminal of output MUX 840 that is programmed to selectively block signals generated in response to the MODE TEST/NORM signal. Further, the components (multiplexers and flip-flops) of BSR cell 800 may be rearranged without changing the function performed. Therefore, the spirit and scope of the appended claims should not be limited to the description of the preferred embodiments contained herein.

What is claimed is:

1. A programmable Boundary-Scan register circuit including a plurality of serially-connected cells, wherein each cell comprises:

a test data input terminal for receiving a test data signal;

a shift register for receiving the test data signal, the shift register having an output terminal;

a test data output terminal;

a configurable bypass circuit for selectively connecting one of the test data input terminal and the output terminal of the shift register to the test data output terminal;

a system data input terminal;

a system data output terminal;

a parallel latch for selectively storing a predetermined test data signal received by the shift register, the parallel latch having an output terminal;

an output multiplexer having a first input terminal connected to the latch output terminal, a second data input terminal for receiving the system data input terminal, an output terminal connected to the system data output terminal, and a select terminal; and a configurable mode control circuit for selectively connecting one of a mode control signal and a disable signal to the select terminal of the output multiplexer.

2. The programmable Boundary-Scan register circuit according to claim 1, wherein the configurable bypass circuit comprises a multiplexer having a first data input terminal connected to the test data input terminal, a second data input terminal connected to the output terminal of the shift register, an output terminal connected to the test data output terminal, and a select terminal connected to a select control circuit.

3. The programmable Boundary-Scan register circuit according to claim 2, wherein the select control circuit comprises a memory cell.

4. The programmable Boundary-Scan register circuit according to claim 1, wherein the configurable mode control circuit comprises a multiplexer having a first data input terminal receiving the mode control signal, a second data input terminal receiving the disable signal, an output terminal connected to the select terminal of the output multiplexer, and a select terminal connected to a select control circuit.

5. The programmable Boundary-Scan register circuit according to claim 4, wherein the select control circuit comprises a memory cell.

6. The programmable Boundary-Scan register circuit according to claim 1, further comprising an input multiplexer having a first input terminal connected to the test data input terminal, a second data input terminal connected to the system data input terminal, and an output terminal connected to the second input terminal of the output multiplexer;

wherein the shift register comprises a first flip-flop having a data input terminal connected to the output terminal of the input multiplexer and a clock terminal for receiving a CLOCK DR signal; and wherein the parallel latch comprises a second flip-flop having a clock terminal for receiving an UPDATE DR signal.

7. A programmable input/output (I/O) circuit for transmitting signals to and receiving signals from an associated device pin, the I/O circuit comprising:

a tri-state buffer having a data input terminal, a control terminal and an output terminal, the output terminal being connected to the device pin;

an input buffer having an input terminal connected to the device pin and an output terminal;

a test data input terminal for receiving a test data signal;

a test data output terminal;

a first programmable Boundary-Scan register cell including a first shift register connected to the test data input terminal and having a first output terminal, and a first configurable bypass circuit for selectively connecting one of the first output terminal of the shift register and the test data input terminal to a first data output terminal;

a second programmable Boundary-Scan register cell including a second shift register connected to the first data output terminal of the first configurable bypass circuit and having a second output terminal, and a second configurable bypass circuit for selectively connecting one of the second output terminal of the second shift register and the first data output terminal to a second data output terminal; and a third programmable Boundary-Scan register cell including a third shift register connected to the second data output terminal of the second configurable bypass circuit and having a third output terminal, and a third configurable bypass circuit for selectively connecting one of the third output terminal of the third shift register and the second data output terminal to test data output terminal.

8. The programmable I/O circuit according to claim 7, wherein each of the first, second and third configurable bypass circuits comprises a multiplexer having a select terminal connected to an associated select control circuit.

9. The programmable I/O circuit according to claim 8, wherein each select control circuit comprises a memory cell.

10. The programmable I/O circuit according to claim 7, wherein the first configurable bypass circuits further comprises:

a system data input terminal connected to the output terminal of the input buffer;

a system data output terminal;

a parallel latch for selectively storing a predetermined test data signal received by the first shift register, the parallel latch having an output terminal;

an output multiplexer having a first input terminal connected to the latch output terminal, a second data input terminal for receiving a system data input signal from the input buffer, an output terminal connected to the system data output terminal, and a select terminal; and a configurable mode control circuit for selectively connecting one of a mode control signal and a disable signal to the select terminal of the output multiplexer.

11. The programmable I/O circuit according to claim 10, wherein the configurable mode control signal comprises a multiplexer having a first data input terminal receiving the mode control signal, a second data input terminal receiving the disable signal, an output terminal connected to the select terminal of the output multiplexer, and a select terminal connected to a select control circuit.

12. The program I/O circuit according to claim 11, wherin the select control circuit comprises a memory cell.

13. An IC device comprising:

a test data input pin;

a test data output pin;

a plurality of device pins;

a plurality of Boundary-Scan register cells, each Boundary-Scan register cell being associated with one of the plurality of device pins, the plurality of Boundary-Scan register cell forming a chain between the test data input terminal and the test data output terminal, wherein each Boundary-Scan register cell includes:

a test data input terminal for receiving a test data signals transmitted along the chain;

a shift register for receiving the test data signal, the shift register having an output terminal;

a test data output terminal for transmitting signals along the chain; and a configurable bypass circuit for selectively connecting one of the test data input terminal and the output terminal of the shift register to the test data output terminal a system data input terminal;

a system data output terminal;

a parallel latch for selectively storing a predetermined test data signal received by the shift register, the parallel latch having an output terminal;

an output multiplexer having a first input terminal connected to the latch output terminal, a second data input terminal for receiving the system data input terminal, an output terminal connected to the system data output terminal, and a select terminal; and a configurable mode control circuit for selectively connecting one of a mode control signal and a disable signal to the select terminal of the output multiplexer.

14. The IC device of claim 13, wherein the IC device is a programmable logic device (PLD) further comprising:

a programmable core logic circuit;

a plurality of input/output (I/O) circuits for selectively transmitting data input signals from an associated device pin to the programmable core logic circuit and transmitting data output signals from the programmable core logic circuit to the associated device pin, wherein each I/O circuit includes a first Boundary-Scan register cell, a second Boundary-Scan register cell and a third Boundary-Scan register cell.

15. The IC device of claim 14, wherein each I/O circuit further comprises:

a tri-state buffer having a data input terminal, an output enable terminal and an output terminal, the output terminal being connected to the associated device pin; and an input buffer having an input terminal connected to the associated device pin and an output terminal;

wherein the first Boundary-Scan register cell includes a data input terminal connected to output terminal of the input buffer;

wherein the second Boundary-Scan register cell includes a data output terminal connected to the data input terminal of the tri-state buffer; and wherein the third Boundary-Scan register cell includes a data output terminal connected to the output enable terminal of the tri-state buffer.

* * * * *